US008398872B2

(12) United States Patent
El Gabaly et al.

(10) Patent No.: US 8,398,872 B2
(45) Date of Patent: Mar. 19, 2013

(54) METHOD FOR PREPARING ULTRAFLAT, ATOMICALLY PERFECT AREAS ON LARGE REGIONS OF A CRYSTAL SURFACE BY HETEROEPITAXY DEPOSITION

(75) Inventors: Farid El Gabaly, Berkeley, CA (US); Andreas K. Schmid, Berkeley, CA (US)

(73) Assignee: The Regents of the University of California, Oakland, CA (US)

( * ) Notice: Subject to any disclaimer, the term of this patent is extended or adjusted under 35 U.S.C. 154(b) by 210 days.

(21) Appl. No.: 12/921,562

(22) PCT Filed: Mar. 10, 2009

(86) PCT No.: PCT/US2009/036619
§ 371 (c)(1),
(2), (4) Date: Sep. 8, 2010

(87) PCT Pub. No.: WO2009/148671
PCT Pub. Date: Dec. 10, 2009

(65) Prior Publication Data
US 2011/0042351 A1 Feb. 24, 2011

Related U.S. Application Data

(60) Provisional application No. 61/039,261, filed on Mar. 25, 2008.

(51) Int. Cl.
*B44C 1/22* (2006.01)
(52) U.S. Cl. .......................... 216/37; 216/58; 204/192.1
(58) Field of Classification Search .................... 216/37, 216/58; 204/192.1
See application file for complete search history.

(56) References Cited

U.S. PATENT DOCUMENTS

| 6,869,480 B1 * | 3/2005 | Abel et al. ................. 117/89 |
| 2008/0026252 A1 * | 1/2008 | Sonoda et al. ............. 428/810 |
| 2009/0098343 A1 * | 4/2009 | Arena et al. ............... 428/172 |

FOREIGN PATENT DOCUMENTS

| WO | 2007145679 A2 | 12/2007 |
| WO | WO 2007/145679 | * 12/2007 |

OTHER PUBLICATIONS

Weiss et al ("Metal oxide heteroepitaxy: Stranski-Krastanov growth for iron oxides on Pt (111)"; Physical Review B, Feb. 15, 1999, vol. 59, No. 7, pp. 5201-5213).*
Cuenat et al., Lateral Templating for Guided Self-Organization of Sputter Morphologies, Advanced Materials, vol. 17, pp. 2845-2849, (2005).

(Continued)

*Primary Examiner* — Shamim Ahmed
(74) *Attorney, Agent, or Firm* — Technology Transfer and Intellectual Property Management Department, Lawrence Berkeley National Laboratory

(57) ABSTRACT

A novel method of forming large atomically flat areas is described in which a crystalline substrate having a stepped surface is exposed to a vapor of another material to deposit a material onto the substrate, which material under appropriate conditions self arranges to form 3D islands across the substrate surface. These islands are atomically flat at their top surface, and conform to the stepped surface of the substrate below at the island-substrate interface. Thereafter, the deposited materials are etched away, in the etch process the atomically flat surface areas of the islands transferred to the underlying substrate. Thereafter the substrate may be cleaned and annealed to remove any remaining unwanted contaminants, and eliminate any residual defects that may have remained in the substrate surface as a result of pre-existing imperfections of the substrate.

19 Claims, 9 Drawing Sheets

OTHER PUBLICATIONS

El Gabaly et al., Imaging Spin-Reorientation of Transitions in Consecutive Atomic Co Layers on Ru(0001), Physical Review Letters, vol. 96, pp. 147202-1-147202-4, (Apr. 14, 2006).

Ling et al., Crucial role of substrate steps in de-wetting of crystalline thin films, Surface Science, vol. 570, No. 3, pp. L297-L303, (Oct. 30, 2004).

Ogino et al., Fabrication and Integration of Nanostructures on Si Surfaces, Accounts of Chemical Research, vol. 32, No. 5, pp. 447-454, (1999).

Bedrossian et al., Layer-by-layer sputtering and epitaxy of Si100), Physical Review Letters, vol. 67, No. 1, pp. 124-127, (Jul. 1, 1991).

Lian et al., Patterning Metallic Nanostructures by Ion-Beam-Induced Dewetting and Rayleigh Instability, Nano Letters, vol. 6, No. 5, pp. 1047-1052, (2006).

Ramana Murty et al., Persistent layer-by-layer sputtering of Au(111), Journal of Applied Physics, vol. 88, No. 1, pp. 597-599, (Jul. 1, 2000).

Tanaka et al., Fabrication of arrays of large step-free regions on Si(001), Applied Physics Letters, vol. 69, No. 9, pp. 1235-1237, (Aug. 26, 1996).

Chang and Blakely, Arrays of widely spaced atomic steps on Si(111) mesas due to sublimation, Surface Science, vol. 591, pp. 133-141, (2005).

Lee and Blakely, Formation and stability of large step-free areas on Si(001) and Si(111), Surface Science, vol. 445, pp. 32-40, (2000).

Rougemaille et al., Exchange-induced frustration in FeÕNiO multilayers, Physical Review B, vol. 76, pp. 214425-1-214425-6, (2007).

Parkin et al., Oscillatory magnetic exchange coupling through thin copper layers, Physical Review Letters, vol. 66, No. 16, pp. 2152-2155, (Apr. 22, 1991).

Unguris et al., Observation of two different oscillation periods in the exchange coupling of Fe/Cr/Fe(100), Physical Review Letters, vol. 67, No. 1, pp. 140-143, (Jul. 1, 1991).

Thürmer et al., Nucleation limited crystal shape transformations, Surface Science, vol. 537, pp. 123-133, (2003).

Weiss and Ritter Metal oxide heteroepitaxy: Stranski-Krastanov growth for iron oxides on Pt(111), vol. 59, No. 7, pp. 5202-5213, (Feb. 15, 1999).

Luth, "Solid Surfaces, Interfaces, and Thin Films" pp. 100-120 (4th ed. 2001).

* cited by examiner

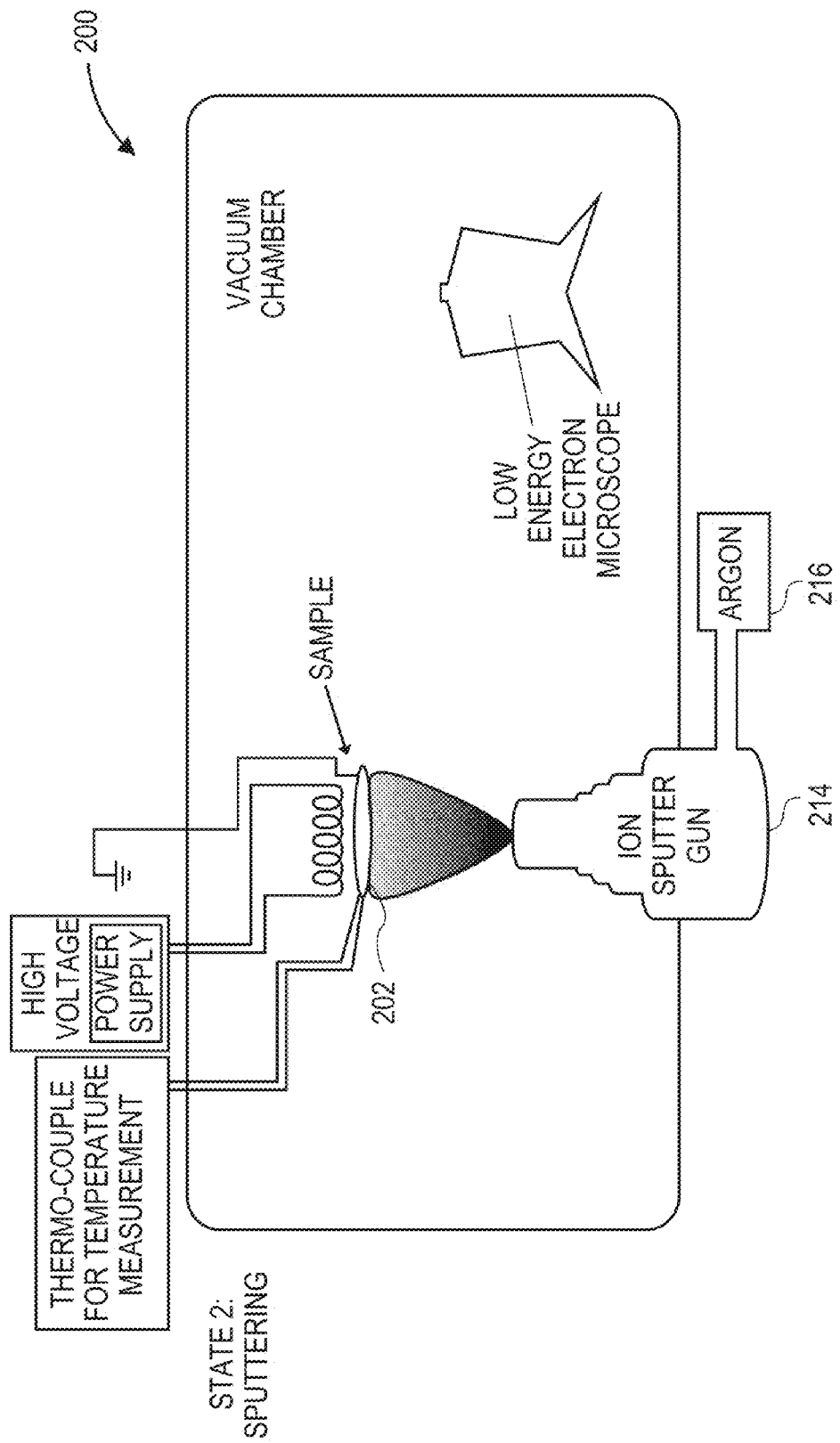

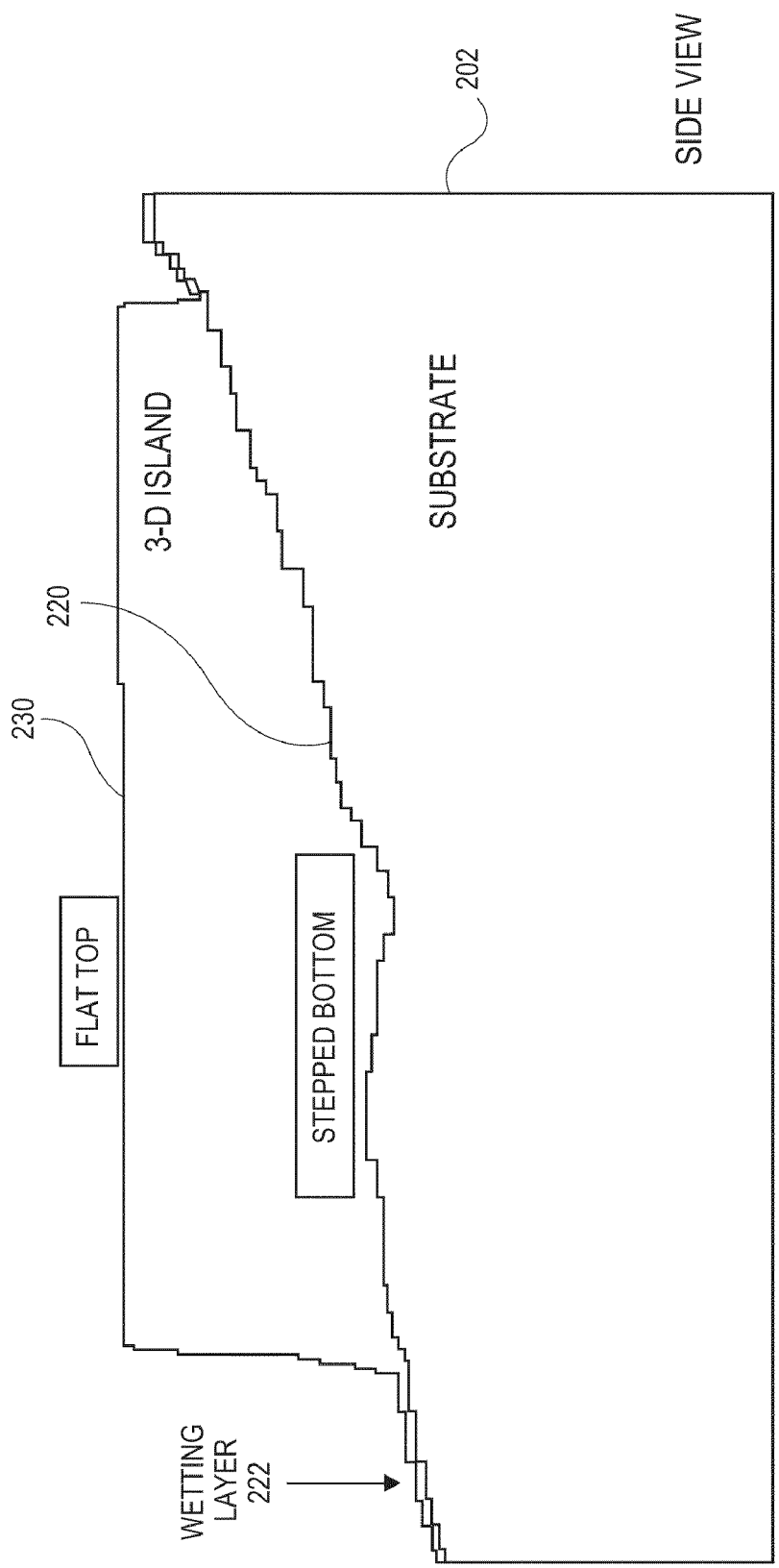

METHOD FOR PREPARING ULTRAFLAT, ATOMICALLY PERFECT AREAS ON LARGE REGIONS OF A CRYSTAL SURFACE BY HETEROEPITAXY DEPOSITION

CROSS-REFERENCE TO RELATED APPLICATIONS

This application claims priority to Provisional U.S. Patent Application 61/039,261 filed Mar. 25, 2008, entitled Method for Preparing Ultraflat, Atomically Perfect Areas on Large Regions of a Crystal Surface by Heteroepitaxy Deposition, which application is incorporated herein by reference.

STATEMENT OF GOVERNMENTAL SUPPORT

The invention described and claimed herein was made in part utilizing funds supplied by the U.S. Department of Energy under Contract No. DE-AC02-05CH11231. The government has certain rights in this invention.

BACKGROUND OF THE INVENTION

1. Field of the Invention

This invention relates generally to atomically flat surfaces, and, more specifically, to a method for forming atomically flat surfaces on a crystalline substrate or on a substrate with crystal texture.

2. Description of the Related Art

Today, the importance of technology based on advanced crystalline materials processing and the miniaturization of devices requires an unprecedented control on the composition and the structure of these materials and their surfaces/interfaces, in many cases down to the atomic level. Examples of these technologies are semiconductor fabrication/processing techniques and high density magnetic-recording devices.

But even the most perfectly polished crystalline materials (as used in actual devices) present surfaces far from flat at nanometer/atomic scales. They are populated with a high density of atomic steps when examined at the sub-micron scale. Even with the most precise cutting of metal or semiconductor slices from boules or ingots of these materials, perfect alignment of the cutting plane with the direction of atomic planes within the boules is not possible, resulting at the atomic level in a stepped profile across the face of the substrate. Yet with further miniaturization of devices, atomic steps under a feature can affect performance, creating the need for atomically flat surfaces.

Currently, when a flat region on the surface is required, one can search the sample to find regions of flatness or terraces. Sometimes, with luck, it is possible to find a naturally formed isolated flat region of small area. Other approaches in the silicon fabrication area have involved the patterning of areas across a wafer using focused ion beam milling (FIB) or standard lithographic techniques, followed by etching to form islands or trenches. Once the patterns are formed on the wafer through standard etching techniques, annealing techniques can be used to create the desired flat areas. As a result of the pre-patterning and annealing, atomic steps on the surface are re-arranged in such ways that step-density is very high in certain regions (for example at the edges of islands or trenches) while, simultaneously, step density is extremely low and can be zero in other regions (for example near the centers of islands or trenches). Such processes are described by S. Tanaka et al., Appl. Phys. Lett., 60, 1235 (1966), T. Ogino et al., Acc. Chem. Res., 32, 447 (1998), D. Lee et al., Surf. Sci., 445, 32-40 (1999), A. Cuenat et al., Adv. Materl, 17, 2845 (2005), and J. Lian et al., Nano Lett., 6, 1047 (2006). So far these processes have only been used on semiconductor wafers. Requiring lithographic steps, the effort and time/cost associated with these processes scales with the amount of surface are that is flattened. Particularly in the case of FIB processing, this is an important economic factor. Clearly, economic advantage would be anticipated in the case of processes that replace lithographic patterning with self-assembled patterns, as has been done in the invention described herein.

SUMMARY OF THE INVENTION

Herein, a simple and straightforward method to improve the standard polished surfaces of a crystalline material and create micron-sized atomically perfect regions is described. The power of this method is boosted by the fact that it is based on self-assembly of materials, so it can be applied to arbitrarily large areas with minimal increases of time or cost.

The method of this invention is based on the hetero-epitaxial deposition of minute amount of a chosen material on top of a crystalline substrate. If the right combination of temperature and deposition rate is achieved, the epitaxial overlayer material will agglomerate in a self-assembly fashion over the whole surface, forming mesa-islands of several microns wide and only a few nanometers tall. The mesas are separated by stepped regions. The mesa islands have a perfectly flat-top, even though they are formed overtop a stepped surface. These "self assembled" islands cover a multiplicity of micron-scale regions that contain many steps with an ultraflat surface, without necessity of any external intervention. The shapes of these mesa-islands is then transferred to the underlying substrate surface by isotropic etch.

Efficient removal of the overlayer material can be achieved using ion beam etch techniques, among others, employing a standard ion sputter gun. The sputter gun shoots energetic ions to the coated surface, so the overlaid and agglomerated material is removed in a controlled way. The removal occurs equally for the overlayer material as well as for the substrate material. At adequate temperature and with well selected settings, the removal can be done atomic-layer by atomic-layer, as described, for example, by P. Bedrossian et al., Phys. Rev. Lett. 67, 124 (1991) or M. V. Ramana Murty, J. Appl. Phys. 88, 597 (2000). In this way the surface shape becomes patterned on the substrate material.

A further controlled modification of the final surface morphology of the substrate can be achieved by melting and re-solidification of the deposited material. By adding an adequate heating and cooling step, dome-shaped islands can be formed with a central flat region on the top, and gently rounded sides. These shapes can then be transferred to the underlying substrate surface by isotropic etch techniques such as ion-sputtering. In some applications, flat regions bounded by rounded areas, as achieved using this additional step, can have advantages over flat regions bounded by more sharply defined perimeters, as achieved when the melting/solidification step is omitted during the fabrication process.

BRIEF DESCRIPTION OF THE DRAWINGS

The foregoing aspects and others will be readily appreciated by the skilled artisan from the following description of illustrative embodiments when read in conjunction with the accompanying drawings.

FIG. 3 is a cross sectional representation of a substrate after deposition and self assembly of the deposited material over a segment of the stepped surface of said substrate.

DETAILED DESCRIPTION

Figure 1:
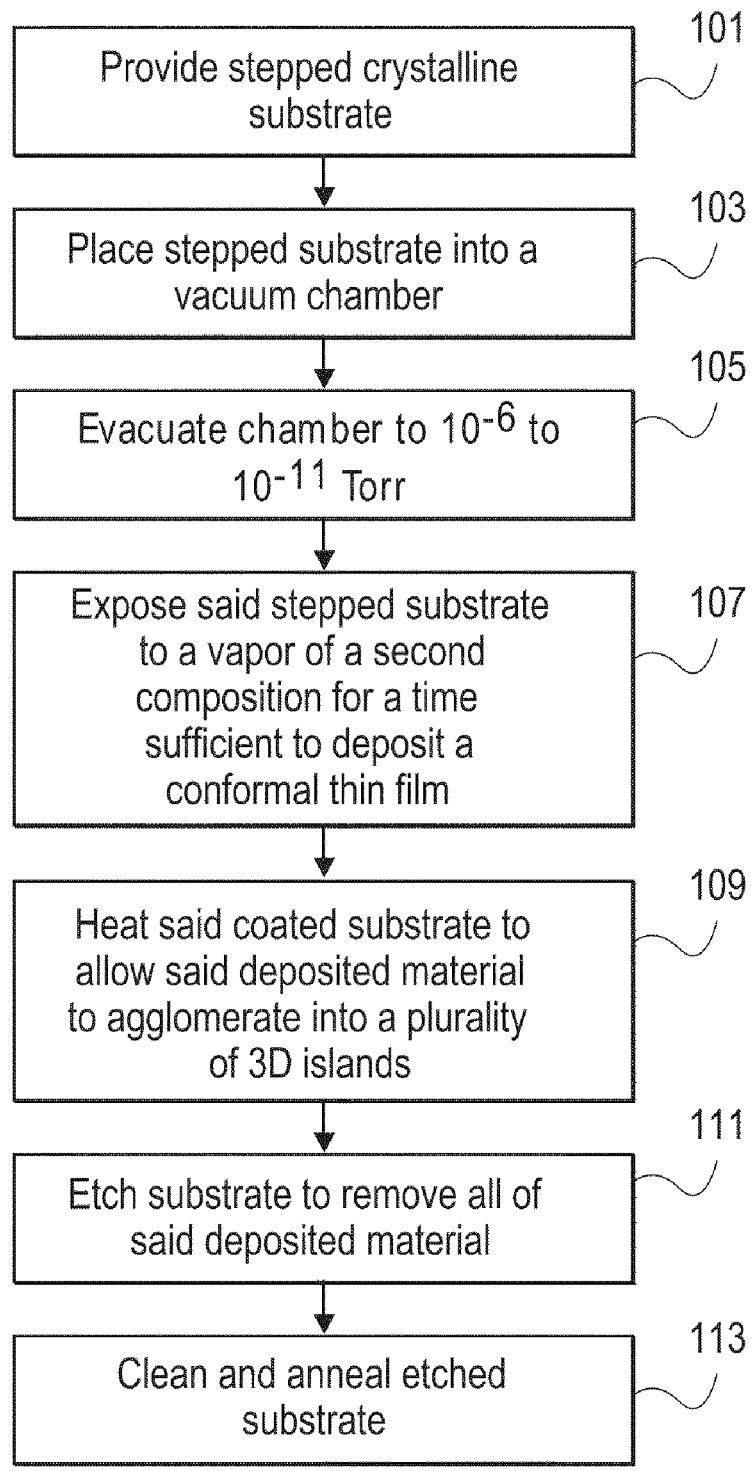
FIG. 1 is a flow chart of the various steps of the method of this invention.

By this invention, a simple procedure has been developed to create micron-scale, essentially perfectly flat terraces separated by step bunches, on very large regions of a crystalline substrate, and without the need of lithographic pre-patterning of the surface. The procedure generally includes three phases. In the first phase, between 30 and 80 atomic layers of a different material are hetero-epitaxially deposited as an overlayer, at moderate substrate temperature. The overlayer material is chosen so it will grow into three-dimensional islands, either by Stransky-Krastanov (SK) or by Vollmer-Weber (VW) growth mode, so that micron-size three dimensional flat-topped islands grow across the whole surface. For this invention, materials are selected such that preferred shapes of the self-assembled areas have extremely flat top surfaces (often entire islands are atomically flat on top) and a stepped interface with the substrate crystal at their bottoms.

In general, when thin films of one material are deposited on top of another material, it is very common that the overlayer material grows in islands in either one of these two growth modes. Very approximately, conditions are such that when the value of the surface tension of the overlayer material is higher than the value of the surface tension of the substrate, then one observes the tendency that the overlayer material "beads up" to form three-dimensional islands situated directly on top of the otherwise bare substrate surface. This growth mode is referred to as Vollmer-Weber growth. When the value of the surface tension of the overlayer material is smaller than that of the substrate material, then one often observes the tendency that a thin, continuous wetting layer first covers the substrate surface, followed by the formation of three-dimensional islands, on top of this wetting layer during further deposition. This latter case is referred to as Stransky-Krastanov growth mode. A third type of film growth is the case when the overlayer forms a continuous film of even thickness across the surface of the substrate, without forming three dimensional islands. This third case is usually the result of kinetic limitations, i.e., overlayer/substrate material combinations that would tend to grow either in SK or in VW modes can be forced to grow as continuous films by depositing the film material at relatively high rate, at relatively low substrate temperature, or both.

For the invention described herein, it is important firstly that SK or VW overlayer islands are formed. Secondly, it is important that the 3D islands grow with a flat facet exposed on their tops. This second condition depends upon (a) the preferred epitaxial relationship of the substrate crystal and the overlayer material, and (b) the relative values of the surface tension of the different crystalline faces of the overlayer material. With either approach, the process employs vapor phase deposition techniques to form the flat topped islands.

Empirically speaking, in the case of low-index substrate surfaces, it is quite common that SK or VW overlayer islands will have such flat facets exposed on their tops, although there are a number of notable exceptions where this is not the case, and overlayer islands have pointed tops (like a pyramid) or sharp ridges (like the roofline of common rooftops on houses). Cases of substrate/overlayer material combinations that have the tendency to faun islands with pointed or ridged tops tend to be less suitable for application in terms of this invention. More details on relevant film growth modes can be found in textbooks such as Solid Surfaces, Interfaces, and Thin Films, by Hans Luth, Springer 2001, ISBN 3540423311, page 100, et seq. and in other primary literature. For this invention, materials are selected such that preferred shapes of the self-assembled areas have extremely flat top surfaces (often entire islands are atomically flat on top) and they have a stepped interface with substrate crystal regions at their bottoms. This type of preferred island shape is found for many combinations of materials, but not for all combinations.

In the second phase, the surface morphology, with ultraflat island surfaces is transferred to the substrate crystal by sputter etching at a suitably selected temperature. Sputtering is continued until the complete removal of the overlayer material leaves an imprinting of the 3-D islands in the substrate surface. In the third and final phase, the process ends with a cleaning and annealing of the surface in order to remove minor atomic-scale defects or imperfections that may have remained in the surface after the sputtering step.

As noted above, Stransky-Krastanov (SK) growth is one of the three primary modes by which thin films grow epitaxially at a crystal surface or interface. Also known as "layer-plus-island growth", the SK mode follows a two step process. Initially, complete films of a material (the adsorbate), up to several monolayers thick are grown in a layer by layer fashion on a crystal substrate. Beyond a critical layer thickness, which depends on details of the interactions between the substrate and the deposited film, growth continues through the nucleation and coalescence of adsorbate islands.

Stransky-Krastanov growth is an intermediary process characterized by both 2D layer and 3D island growth. Transition from the layer by layer to island based growth occurs at a critical layer thickness which is highly dependent on the chemical and physical properties of the materials in question, such as surface energies and lattice parameters of the substrate and film, as well as the temperature at which the deposition process is carried out. In one embodiment, these films can be grown to final thickness at a relatively low temperature, and after completion of film formation, the temperature increased to cause flow and agglomeration of the film into 3D islands separated by a thin wetting layer. In another embodiment, the film can be deposited at higher temperatures, whereby beyond certain deposition thickness, the deposited material agglomerates into separate islands.

Once the islands are formed they can be enlarged by a process known as Ostwald ripening. This is a growth mechanism where small islands dissolve and are consumed by larger islands. As a result the average size of the remaining islands increases with time. The process of Ostwald ripening is familiar to those skilled in the art, and is not further described herein.

An optimized 'recipe' needs to be tuned for every combination of different materials to be prepared by the methods of this invention. The recipe consists of: i) overlayer material (chosen by their alloy properties, surface tension properties and diffusion properties), ii) deposition flux, and iii) temperature (sometimes dynamic changes are required, i.e. start depositing the overlayer at room temperature and then raise the temperature after some overlayer material is already on the surface). Once the recipe is optimized, ideally with the help of microscopy techniques, the procedure can be repeated without the need to check every step. The development of a particular recipe for a particular combination of materials is well within the still of the art, can be developed by routine experimentation, and accordingly the development of a particular recipe does not faun a part of this invention.

With reference now to FIG. 1, an embodiment in which flat, 3D islands are assembled using Stransky-Krastanov growth mechanisms is described. In first step 101, a stepped crystalline substrate is provided. The substrate can be a conductor such as a metal, or a semiconductor such as silicon, silicon germanium, and the like. Generally the conductor or semiconductor will be formed from a single crystal, or boule, the selected substrate comprising a slice from the boule. In the course of slicing, typically there is a misalignment of the cut line with the plane of the crystal lattice, this mismatch resulting at the atomic level in a stepped profile of the surface of the substrate, such as representationally depicted in FIG. 3.

In step 103, the substrate is placed into a vacuum chamber and the chamber evacuated in step 105 to low pressures, generally between $10^{-6}$ to $10^{-11}$ Torr. The most appropriate vacuum pressure range for a particular application of this invention is largely a function of the reactivity of the materials being processed, among other factors such as economic constraints. In cases involving only noble metals, for example, low reactivity of the materials may make it feasible that processing can be done successfully at relatively modest vacuum conditions, such as $10^{-6}$ Torr. Processing of more reactive substrate and/or overlayer materials may make it necessary that very clean vacuum conditions are provided, such as $10^{-11}$ Torr. The chamber is equipped with an evaporative element to sublimate the material to be epitaxially deposited over the chosen substrate sample. For example, Knudsen-cell-type or E-beam evaporators can be used, or sputter-deposition sources. Many types of such sources can be constructed or can be obtained through commercial vendors, including Omicron, Specs, McAllister Technical Services, AJA, and many others. The material to be deposited is a material which is also crystalline, and is selected to avoid the possibility of intermixing with the substrate. The methods for achieving these levels of vacuum are well known in the art and will not be further described herein.

In next step 107 the substrate is exposed to the vapor of the selected material for a period of time sufficient to deposit approximately 30-80 atomic layers of material overtop the substrate, with the substrate maintained at moderate temperatures. Generally these temperatures will range between room temperature and up to about 1,000 Celsius, though more commonly between room temperature and 600 Celsius. The time of deposition necessary to form the appropriate layer thicknesses will be a function of deposition rates, which can be easily determined by routine experimentation for a particular material. Once the deposition rate is established at a particular pressure and substrate temperature, the film thickness can easily be controlled by limiting the time of the vapor deposition process.

In step 109 deposition is completed while heating the substrate to enable the deposited material to self assemble into 3D islands. In the process, depending on which substrate/overlayer combination is used, a wetting layer may be formed between the various islands, as illustrated in FIG. 3. The self assembly/agglomeration process is allowed to continue for a period of time sufficient to achieve the desired sizes of islands (for example micrometers diameters) and desired density of islands (for example 10 islands per 100 micrometer-squared) whereby the island heights are grown sufficiently large such that they equal or exceed the maximum variation in step height of that portion of the substrate surface, i.e. region, which they overlay. Using low-energy electron microscopy (or other experimental instrumentation with adequate sensitivity), the whole self assembly process can be observed in-situ and in real-time. Therefore optimal temperature settings, annealing times, and optimal dose of film material are determined without difficulty. After such measurements, the optimized recipes can be transferred to a processing tool which is equipped to carry out all the required steps of the recipe. While this tool might not include sensitive monitoring instrumentation, the transfer of processing to a dedicated tool might be economically beneficial.

It is to be noted that during the agglomeration process, smaller islands will to a certain extent by Ostwald ripening agglomerate to the larger islands.

In step 111, after the deposition and agglomeration step is completed, the deposited materials are etched away until all of the deposited material has been removed. In this isotropic etch process, the conformal nature of the etch process transfers the flat planed regions of the island to the surface of the substrate, resulting in areas of flatness that reproduce the flat areas of the islands, with stepped regions in-between. The etch process can be carried out by conventional means, such as sputter etch or ion beam etch.

Finally, to complete the process, in step 113 the substrate is cleaned and annealed. The purpose of this cleaning/annealing step is to eliminate any residual defects that may have remained in the substrate surface as a result of pre-existing imperfections of the substrate, or as a result of the prior etching or other processing steps. One may want to remove minute amounts of possible contaminating material such as carbon, one may want to remove atoms of the sputtering gas that have become implanted into the substrate during etching, or one may want to anneal simply to ensure ultimate perfection of the flattened regions on the processed substrate. Depending on substrate material, cleaning can be achieved by exposure of the substrate to reactive gases (for example, ruthenium, tungsten and molybdenum can be cleaned by exposure to oxygen), or by ion beam sputtering with reduced beam energy, reduced beam intensity, or a different composition of sputtering gas. For example, sputter gases with different atomic mass, such as helium, neon, argon, or xenon can be used to select cleaning efficiency for specific contaminants, or selectivity of the sputtering process can be optimized for cleaning purposes by the addition of reactive gases, such as hydrogen or oxygen. It has been found that an adequate final annealing step, such as at few hundred to a few thousand degrees Celsius for the duration of a few seconds or minutes, can be effective as a means to remove individual atomic steps from flattened regions, so that the size of regions with perfect atomic-scale flatness is maximized.

Figure 2A:
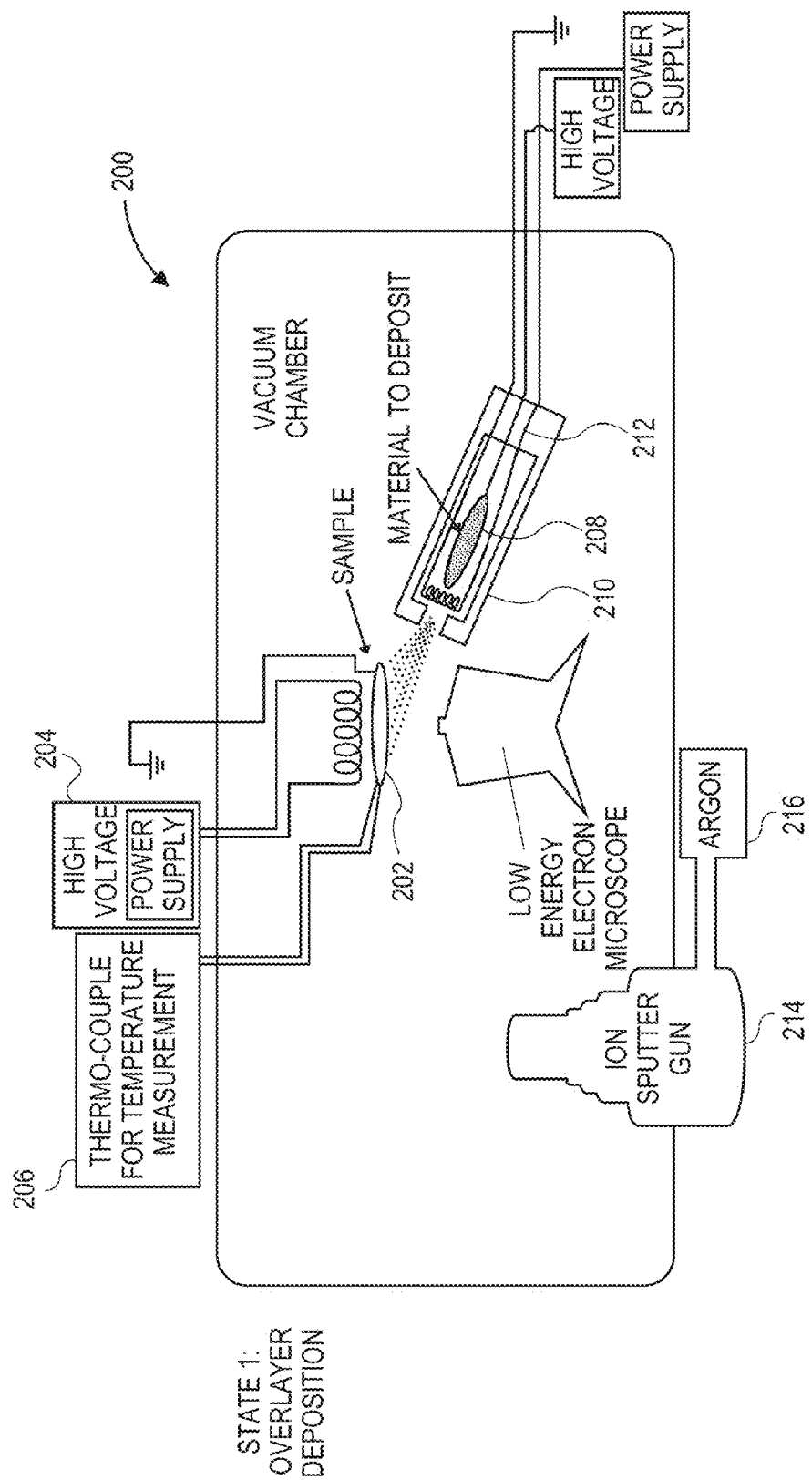
FIG. 2 is a schematic diagram of an apparatus which may be used for carrying out the method of this invention.

With reference now to FIG. 2A, an apparatus suitable for the conduct of the methods of this invention is shown. Within vacuum chamber 200, the substrate 202 is positioned, and the chamber pumped to vacuum (pump not shown). The substrate is affixed to a support provided with a separate heating system 204, a thermocouple 206 used to monitor/regulate substrate temperature. In the first phase of the process, with the wafer at the desired temperature, it is exposed to a vapor of the material 208 to be deposited, the vapor formed in unit 210, separately heated by coil 212 which is connected to its own power supply. Once the deposition recipe is completed, the wafer may be further heated to agglomerate the deposited material, the degree of agglomeration monitored by a Low Energy Electron Microscope.

After 3D island formation is complete, the substrate is then brought into proximity of ion sputter gun 214 (as depicted in FIG. 2B), connected to a source of sputter gas 216, which in one embodiment can be argon. Sputtering is continued until all of the deposited material is removed. Adequate detection techniques, such as Auger electron spectroscopy, are used to determine the appropriate point in time when all deposited material has been removed and the sputter-etch can be stopped. Thereafter, the clean and anneal process can be completed within vacuum chamber 200, where the most appropriate process may involve simply some change of the sputtering conditions as described above, and a brief period of heating the substrate to an appropriate temperature.

Figure 4:
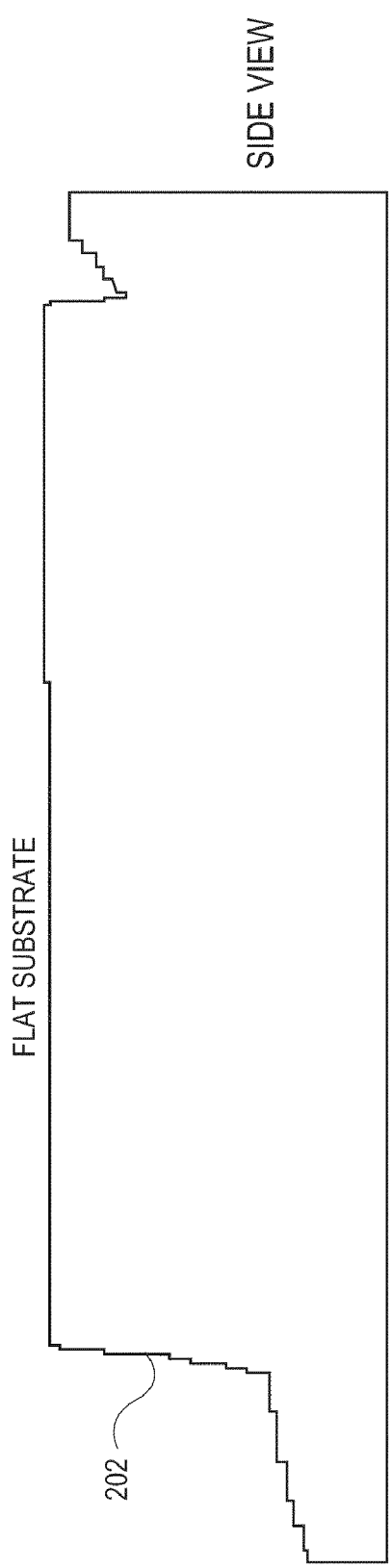
FIG. 4 is a cross sectional representation of the same substrate section after completion of a sputter etch, wherein all of the deposited material has been removed.

With reference to FIG. 3, a section of a stepped substrate is depicted after the deposition step is complete. In the view, stepped substrate 202 is illustrated with 3D island 230 deposited there over. The island has an atomically flat top surface, and a stepped bottom surface 220 which matches the steps of that region of the substrate which it overlies. In the embodiment in which the islands are formed by SK growth, a stepped wetting layer 222 forms in-between islands. Results are similar for VW type growth, but without wetting layer formation. In FIG. 4, the same representative section is depicted; all of the deposited material etched away, the flat topped topography of the island now transferred to the substrate.

Figure 5:
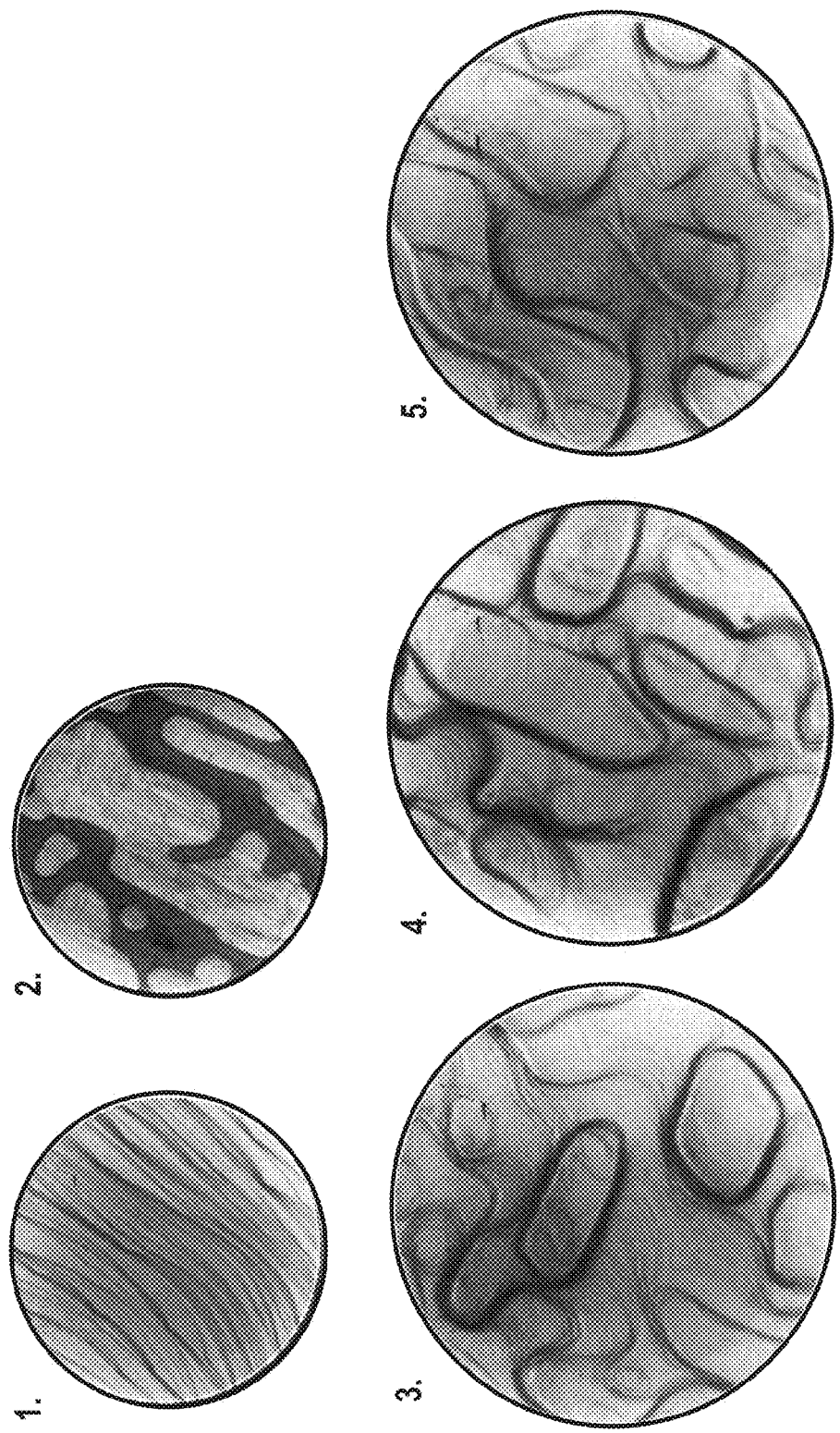
FIG. 5 are low energy electron microscopy images of various portions of a copper metal substrate before, during and after processing.
Figure 6:
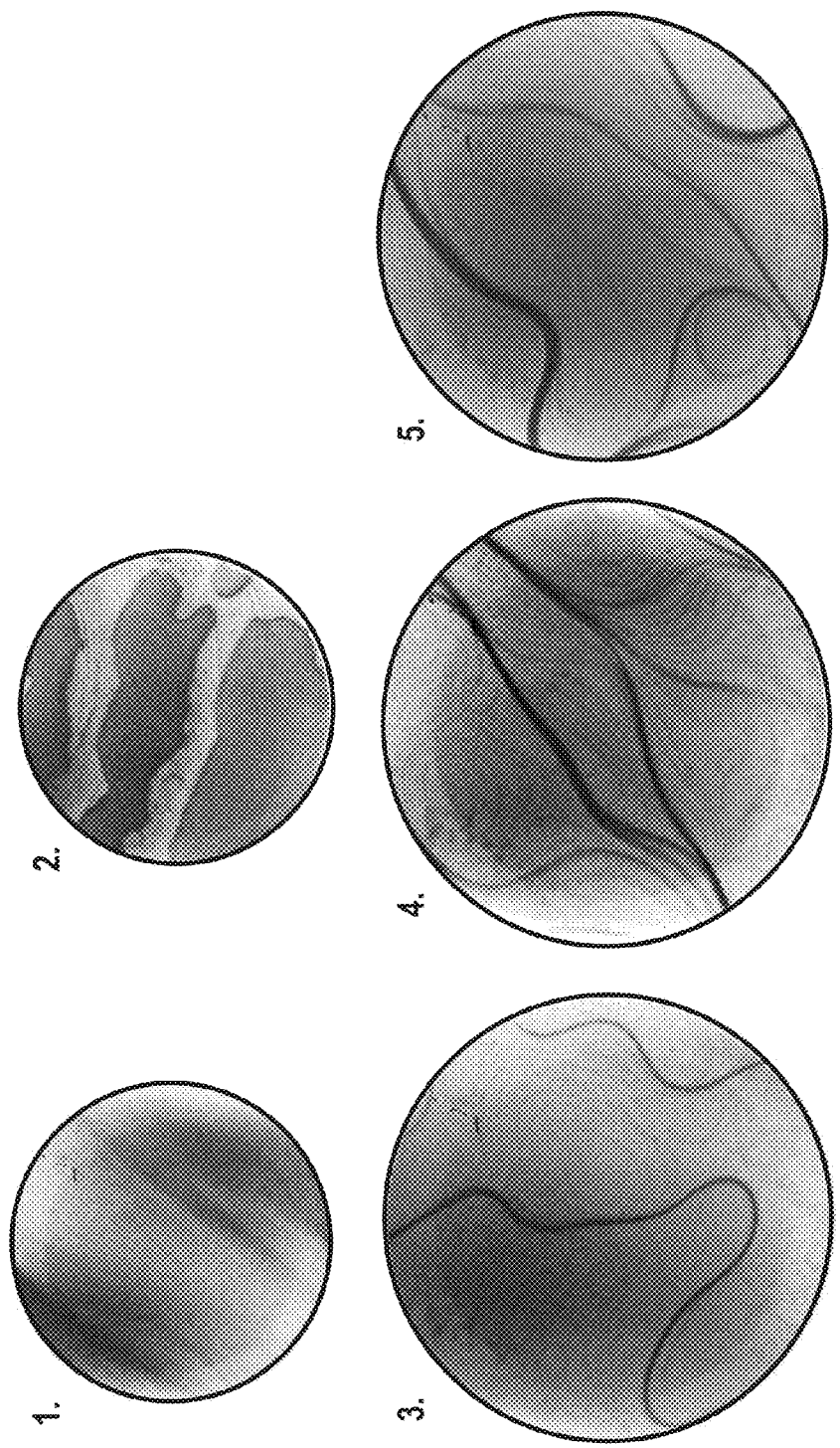
FIG. 6 are low energy electron microscopy images of various portions of a tungsten metal substrate before, during and after processing.
Figure 7:
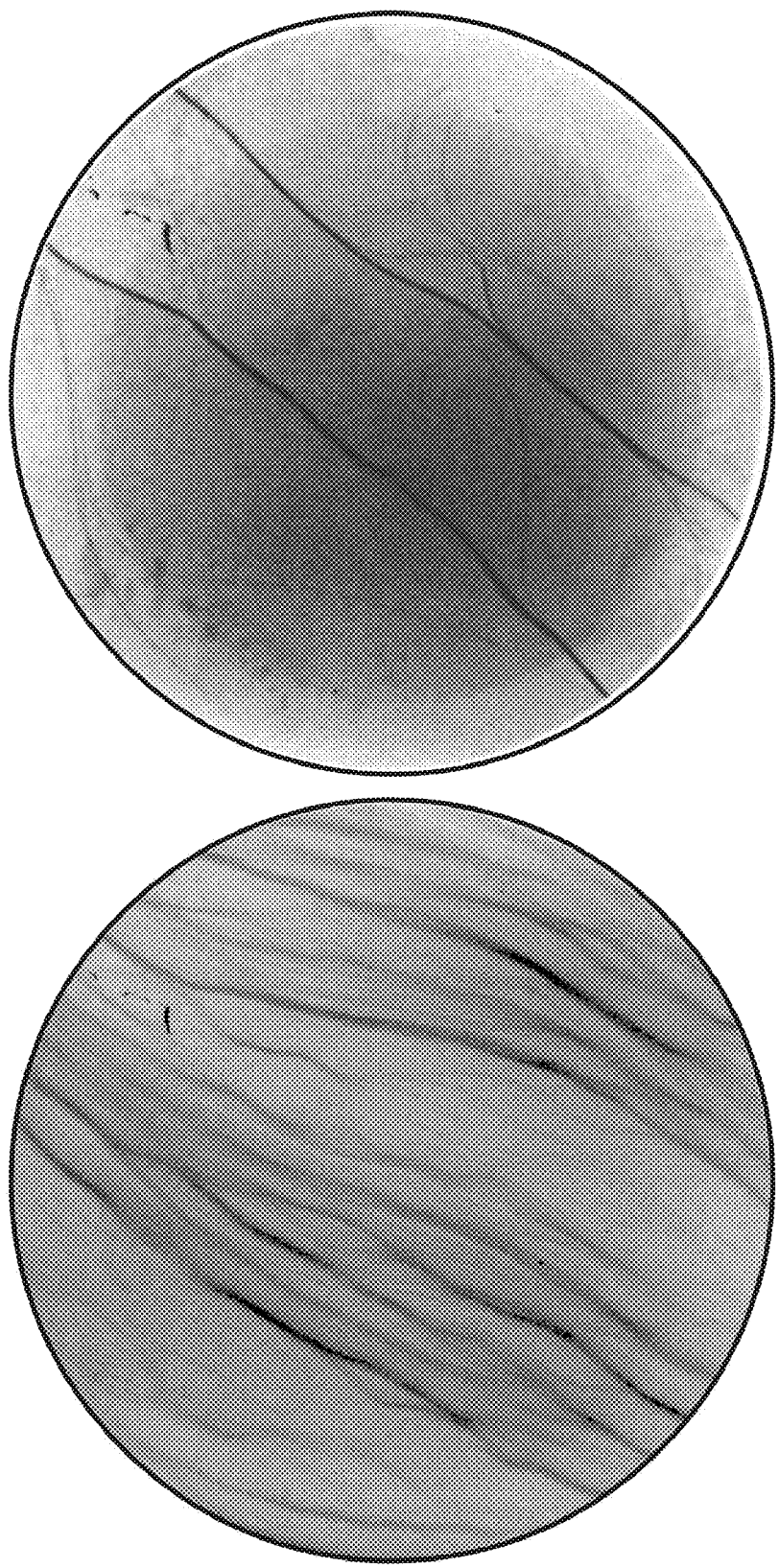
FIG. 7 is a low energy electron microscopy image of a 5 micron wide section of a ruthenium surface, the images of a similar region of the same sample taken before (left), and after (right) the flattening method of the invention.
Figure 8:
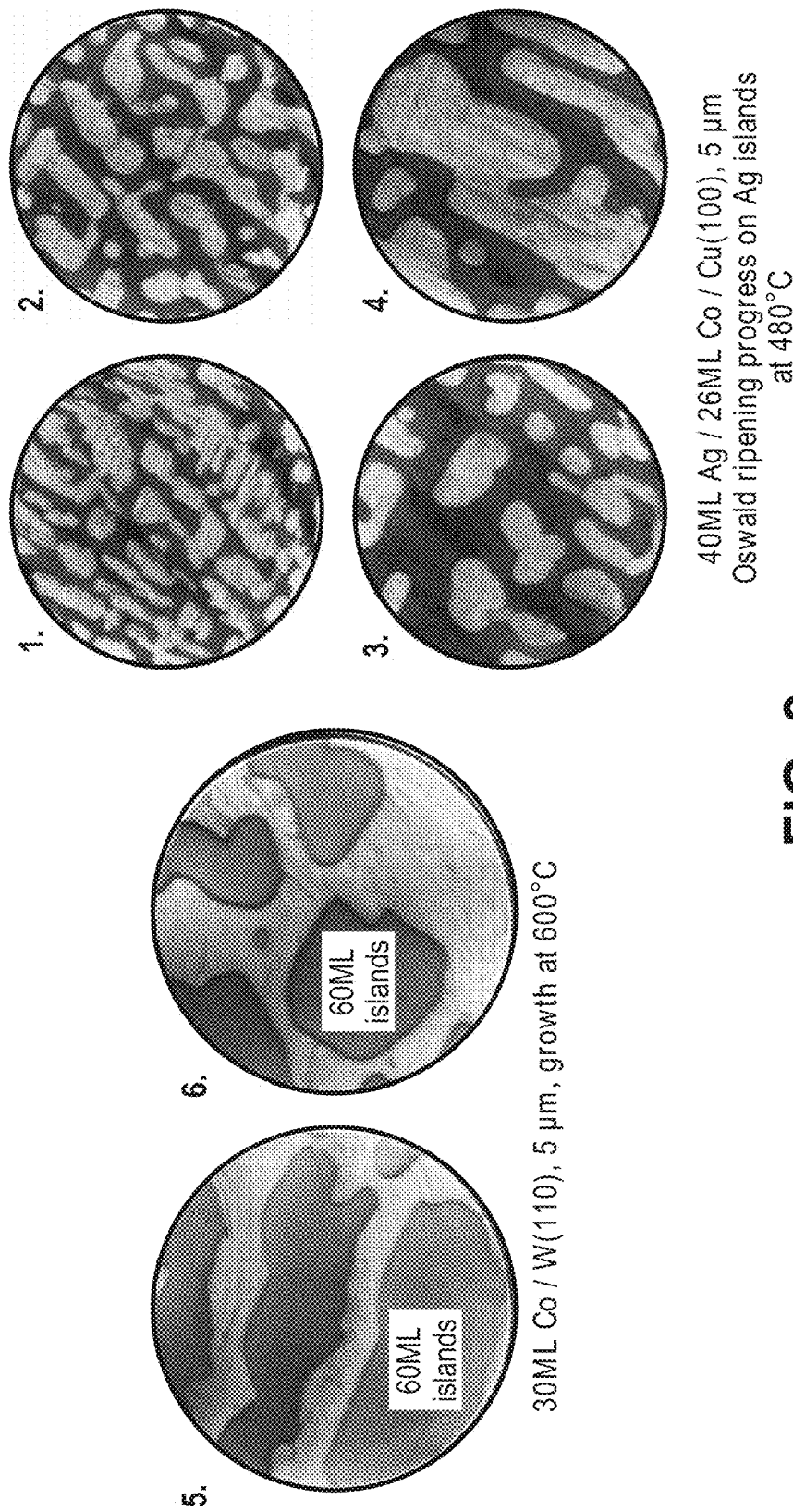
FIG. 8 is a collection of electron microscopy images taken of 5 micron wide sections of various substrates illustrating the creation of flat islands according to the methods of this invention, including the growth of islands by Ostwald ripening at 480° C.

In FIG. 5, view 1 is a picture of a copper surface before processing, view 2 a view of a representative section of the same substrate after deposition and island formation. Views 3, 4 and 5 show various areas of the same substrate after completion of the sputter process in which all of the deposited material has been removed and the flat topography of the formed islands transferred to the substrate. FIG. 6 includes similar pictures/sequences for a tungsten substrate processed according to the methods of this invention, and FIG. 7 shows a before and after sequence for a ruthenium sample. Finally, in FIG. 8, views 5 and 6 depict results of the process of this invention for cobalt deposition on a tungsten substrate by SK growth. Views 1-4 show deposition of a silver metal onto a copper substrate in which a barrier layer of cobalt has been first deposited to prevent the mixing of the silver film with the copper substrate, the process subject to Ostwald ripening at 480C.

Exemplary stepped crystal substrates which may be flattened according to the methods of this invention, as noted before include crystalline conductor and semiconductor materials, as well as oxides and other insulators, superconductors, etc. Suitable conductor materials which may be treated according to the methods of the invention include copper, iron, molybdenum, nickel, ruthenium, tungsten, and a vast variety of other metals and alloys, such as platinum, palladium, cobalt, permalloy, $Cu_3Au$, nickel-based superalloys, and many other metallic compounds or elements. Suitable semiconductor materials and oxides include silicon, silicon-germanium, gallium-arsenide, and, many other elemental and compound materials, such as silicon-carbide, cuprate-superconductors, anatase and other phases of titanium-oxide, magnesium-oxide, and the like.

It is advantageous in selection of the deposited (adsorbate) materials that alloying of the substrate material and the deposited material is avoided or suppressed, either by choosing materials that do not mix for thermodynamic reasons (for example, this tends to be the case when atomic diameters of substrate and overlayer material are substantially different), or by choosing materials where intermixing can be kinetically suppressed (for example this tends to be the case when interatomic bond strength are substantially stronger in the substrate material than they are in the overlayer material). In cases where the possibility of intermixing cannot be prevented in either of these two ways, one can search for and implement an adequate material to form a barrier layer between the substrate and the island-forming overlayer, as a way to prevent intermixing of substrate and overlayer material during required annealing steps. The implementation of barrier layers to prevent overlayer/substrate interdiffusion is a technique that is used in the semiconductor processing industries and can be considered familiar to those skilled in the art.

Example

Detailed Procedure for Flattening of W(100) Single Crystal

Thirty atomic layers of cobalt (Co) were deposited on atomically clean tungsten (W) (100). The cobalt deposition rate was 1 atomic layer per 31 seconds. The W substrate temperature was 100° C. throughout the deposition of the first 10 atomic layers of Co. The background pressure of the chamber was $4.2 \times 10^{-11}$ torr during the process. After the first 10 layers the temperature of the W was increased to 600° C. and the Co deposition rate increased to (approx) 1 atomic layer every 20 seconds. The islands started to form and had atomically-flat tops. They grew in lateral size until they covered ~50% of the surface. The remaining ~50% was covered by 1 or 2 atomic layers of Co. After depositing a total dose of cobalt that would correspond to 30 atomic layers of cobalt in a continuous film, the deposition was stopped and the sample allowed to cool down. The entire process was monitored in-situ and in real time by Low-Energy Electron Microscopy.

The sample (still inside the same vacuum chamber) was then transferred within the chamber to a position where the sample faced a sputter ion-source. Sputtering was conducted for 1 hour with argon (Ar) ions at 2 kV, using a Leybold-Heraeus commercial sputter gun (an equivalent instrument is now produced by SPECS GmbH). The Ar pressure in the chamber was set to $7.7 \times 10^{-7}$ torr, by introducing Ar into the ionization-cell of the sputter ion gun. All the sputtering process was done at room temperature (30° C. approx). During the sputtering process, both the islands and substrate surfaces were simultaneously etched. The result was the homogeneous removal of all the Co and part of the W. As a result, the shape of the surface as it was prior to the beginning of sputtering, including the flat-top islands, was transferred into the pure substrate. In-situ Auger electron spectroscopy (AES) was used to check the chemical cleanliness of the W.

The process ended with the cleaning of the W(100) sample as usual, by flash annealing during exposure to oxygen (to help remove possible carbon contamination that commonly occurs in bulk tungsten samples). The process was done in three flashes in which the sample temperature ramped up to 2000° C. in 50 seconds with a background pressure of oxygen $3 \times 10^{-8}$ torr, with cooling pauses of approximately 5 minutes duration. An additional two flashes without oxygen were done at the end to remove all the oxygen. Finally, inspection by low-energy electron microscopy revealed that indeed, the flat-top island morphology of the cobalt film had been transferred into the pure tungsten substrate; so that the substrate now had large atomically flat, step-free, regions on its surface.

Exemplary Application

When thin layers of non-ferromagnetic material are used to separate layers of ferromagnetic material, important and useful effects are observed. For example, it has been shown by S. S. P. Parkin et al., Phys. Rev. Lett. 66, 2152 (1991) that when two cobalt layers are separated by a thin spacer-layer made of copper, the preferred relative magnetization direction of the two Cobalt layers is an extremely sensitive function of the thickness of the copper spacer. When anti ferromagnetic chromium is used to separate two iron layers, then atomic-scale thickness variations of the chromium layer are observed to result in complete reversals of the coupling direction between the two iron layers, this phenomenon was described by Unguris et al, Phys. Rev. Lett. 67, 140 (1991). Pioneering research including these examples has firmly established the importance of atomic-scale control of interface flatness in producing magnetic multilayer structures with well-defined properties.

Intense interest in these phenomena within the data-storage industries highlights the usefulness of precisely controlled magnetic multilayer structures. The so-called "giant magneto-resistance" effect is a phenomenon that arises in well-controlled magnetic multilayer structures, and it has enabled the enormous growth of data-storage density in modern hard-disks: in all modern hard-drives, the read-head comprises a magnetic multilayer stack that "reads" information from the platter by sensing changes of its giant magneto-resistance when differently magnetized regions of the storage platter come into the read-head's vicinity.

Functionality of these magnetic multilayer stacks depends on well-controlled thicknesses of the various layers, and often atomic-level control over interface quality is crucially important. The multilayer stacks include interfaces between ferromagnetic (FM) layers (typically iron, cobalt, nickel, or alloys of these) and non-magnetic (NM) layers (more precisely, these NM-layers are either paramagnetic or diamagnetic; materials can include copper, ruthenium, or other non-ferromagnetic metals or alloys, or other materials such as oxides or semiconductors). The multilayer stacks often also include well-controlled interfaces between ferromagnetic layers and anti-ferromagnetic (AFM) layers.

For both classes of interfaces, FM/NM and FM/AFM, evidence has shown that atomic-level control over interface roughness is a crucial factor in determining magnetic properties of the overall structure. This research field is a focus-area of scientific activities. For example, the importance of large, flat, defect-free interfaces in an FM/NM layer system has recently been demonstrated (see F. El Gabaly et al., Phys. Rev. Lett 96, 147202 (2007)), as well as the effects of atomic-scale interface roughness in FM/AFM interfaces (see N. Rougemaille et al., Phys. Rev. B 76, 214425 (2007)).

Experimental observations by spin-polarized low-energy electron microscopy of Fe/NiO/Fe(100) multilayer film samples suggest that unpaired spins at the Fe/NiO interfaces are a driving force for the observed exchange coupling between two Fe layers, through the anti ferromagnetic spacer layer (see N. Rougemaille et al., Phys. Rev. B 76, 214425 (2007) and references given herein). It is conjectured that the forces that stabilize the observed magnetic disorder are exchange forces due to uncompensated spins associated with defects such as atomic steps, located at the nominally compensated NiO/Fe(100) interfaces.

To test this hypothesis, Fe/NiO/Fe trilayers were prepared on ultraflat Fe(100) substrates with ~micron-scale regions that are essentially perfect and free of steps. In Fe capping layers of Fe/NiO/Fe(100) trilayers grown on step-free regions of the substrate, produced using the methods of this invention, mostly large, single magnetic domains were observed, instead of the nano-scale domain structures commonly found in trilayers grown on stepped substrates. This supports the idea that uncompensated spins associated with atomically rough Fe/NiO interfaces drive the exchange coupling observed in these structures.

This invention has now been described herein in considerable detail to provide those skilled in the art with information relevant to apply the novel principles and to conduct the methods and operations of the invention as required. The preferred embodiments have been described for the purposes of illustration only. It is to be understood that the invention can be carried out by different equipment, materials and devices, and that various modifications, both as to the equipment and operating procedures, can be accomplished without departing from the scope of the invention itself.

We claim:

1. A method including:
    providing a substrate of a first composition, the substrate having a stepped surface;
    placing the substrate into a vessel;
    evacuating the vessel;
    providing a vapor composed of a second composition, the second composition being different than the first composition of the substrate;
    exposing the substrate, while within the evacuated vessel, to the vapor for a time sufficient to hetero-epitaxially form a plurality of 3D islands of the second composition over the stepped surface of the substrate;
    heating the substrate during the exposing operation to grow the 3D islands to where the height of the 3D islands at their highest point exceed the maximum variation in step height of the stepped surface;
    after heating the substrate during the exposing operation, heating and cooling the substrate to melt and re-solidify the second composition; and
    etching the deposited second composition and the substrate for a period of time sufficient to remove all of the deposited second composition from the substrate, wherein the stepped surface of the substrate is atomically flat after the etching operation.

2. The method of claim 1 wherein the substrate is a crystalline substrate.

3. The method of claim 2 wherein the crystalline substrate is a crystalline metal substrate comprising a single crystal.

4. The method of claim 2 wherein the crystalline substrate is a semiconductor substrate.

5. The method of claim 1 wherein during the exposing operation a conformal film is first formed over the substrate.

6. The method of claim 5 wherein during the exposing operation, the substrate is further heated whereby the conformal film agglomerates into the plurality of 3D islands of the second composition dispersed over the stepped surface of the substrate, the 3D islands interconnected one to the other by a conformal wetting layer extending over the substrate.

7. The method of claim 1 further including:
    annealing the substrate after the etching operation.

8. The method of claim 1 wherein the etching operation is an isotropic etch.

9. The method of claim 8 wherein the isotropic etch s a sputter etch,

10. The method of claim 9 wherein the sputter etch is performed by layer by layer ion beam sputtering.

11. The method of claim 1 wherein the vapor comprises a sublimed metal.

12. The method of claim 1 wherein during the heating operation the substrate is heated to a temperature of between room temperature and 1,000° C.

13. The method of claim 1 wherein during the exposing and heating operations the substrate is maintained at a pressure of between $10^{-6}$ to $10^{-11}$ torr.

14. A method comprising:
 providing a substrate having a stepped surface;
 depositing a conformal barrier layer onto the stepped surface of the substrate;
 growing 3D islands on the conformal barrier layer, the 3D islands having a substantially atomically flat top surface, wherein the barrier layer prevents mixing of the substrate and the 3D islands; and
 simultaneously etching the substrate and the 3D islands to remove the 3D islands whereby the flat surface topology of the 3D islands is transferred to the substrate.

15. The method of claim 14 wherein the etching is isotropic.

16. The method of claim 14 further including:
 annealing the substrate to further atomically flatten the substrate.

17. The method of claim 14 wherein the 3D islands are formed of a crystalline material having a different composition that that of the substrate.

18. The method of claim 14 wherein the 3D islands are formed of a crystalline material having the same composition as that of the substrate.

19. The method of claim 1, wherein heating and cooling the substrate to melt and re-solidify the second composition forms dome-shaped 3D islands having a central flat region and rounded sides.

* * * * *